(12) United States Patent
Yan et al.

(10) Patent No.: US 9,697,938 B2
(45) Date of Patent: Jul. 4, 2017

(54) PSEUDO-8-SHAPED INDUCTOR

(71) Applicant: MARVELL WORLD TRADE LTD, St. Michael (BB)

(72) Inventors: Wen Yan, Shanghai (CN); Hongzheng Han, Shanghai (CN); Zhao Liu, Shanghai (CN); Zhenhua Xiong, Shanghai (CN); Yuan Lu, Sunnyvale, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 14/596,817

(22) Filed: Jan. 14, 2015

(65) Prior Publication Data

US 2015/0206634 A1  Jul. 23, 2015

Related U.S. Application Data (60) Provisional application No. 61/928,787, filed on Jan. 17, 2014.

(51) Int. Cl.
*H01F 27/28* (2006.01)
*H01F 5/00* (2006.01)
(Continued)

(52) U.S. Cl.
CPC ......... *H01F 5/003* (2013.01); *H01F 17/0006* (2013.01); *H01F 17/02* (2013.01); *H01F 27/346* (2013.01); *H01F 41/041* (2013.01); *H01L 23/5227* (2013.01); *H01F 17/0013* (2013.01); *H01F 2017/0046* (2013.01); *H01F 2017/0073* (2013.01); *H01L 2924/0002* (2013.01); *Y10T 29/4902* (2015.01)

(58) Field of Classification Search
CPC ........ H01F 5/003; H01F 17/02; H01F 41/041; H01F 27/2823; H01F 19/04; H01F 27/306; H01F 27/28; H01F 27/327
USPC .......................... 336/182, 225, 180, 200, 226
See application file for complete search history.

(56) References Cited

U.S. PATENT DOCUMENTS 4,052,785 A * 10/1977 Duncan ................... H01F 17/06
29/605
5,929,738 A * 7/1999 Orlando .................. H01F 19/04
336/12

(Continued)

FOREIGN PATENT DOCUMENTS

| WO | WO 2006/105184 A1 | 10/2006 |
| WO | WO 2009/101565 A1 | 8/2009 |
| WO | WO 2009/144211 A1 | 12/2009 |

OTHER PUBLICATIONS

International Search Report and Written Opinion issued Mar. 31, 2015 in PCT/US2015/011754.

(Continued)

*Primary Examiner* — Elvin G Enad
*Assistant Examiner* — Kazi Hossain (57) ABSTRACT

Aspects of the disclosure provide a device that includes a first inductor. The first inductor includes a first coil portion having more than one turn that defines a first enclosed area and a second coil portion having more than one turn that defines a second enclosed area. The first coil portion and the second coil portion are arranged to generate magnetic fields having substantially equal strength and opposite directions.

16 Claims, 6 Drawing Sheets

(51) Int. Cl.
*H01F 17/02* (2006.01)
*H01F 41/04* (2006.01)
*H01F 27/34* (2006.01)
*H01L 23/522* (2006.01)
*H01F 17/00* (2006.01)

(56) References Cited

U.S. PATENT DOCUMENTS

| | | | | |
|---|---|---|---|---|
| 5,969,590 | A * | 10/1999 | Gutierrez | H01F 27/2804 336/200 |
| 7,420,452 | B1 * | 9/2008 | Lee | H01F 17/0006 336/200 |
| 7,663,463 | B2 * | 2/2010 | Lin | H01F 17/0006 336/200 |
| 8,054,153 | B2 * | 11/2011 | Jeon | H01F 21/12 257/531 |
| 8,963,671 | B2 * | 2/2015 | Chen | H01L 23/5227 336/182 |
| 2004/0140528 | A1 * | 7/2004 | Kim | H01F 21/12 257/537 |
| 2004/0140878 | A1 * | 7/2004 | Heima | H01F 17/0013 336/223 |
| 2004/0182602 | A1 * | 9/2004 | Satoh | H01F 17/0006 174/258 |
| 2005/0195061 | A1 * | 9/2005 | Terrovitis | H03H 7/0115 336/200 |
| 2005/0195063 | A1 * | 9/2005 | Mattsson | H01F 27/346 336/225 |
| 2007/0085617 | A1 * | 4/2007 | Salerno | H03F 1/42 331/167 |
| 2007/0158782 | A1 * | 7/2007 | Heikkinen | H01F 17/0006 257/531 |
| 2008/0042792 | A1 * | 2/2008 | Chiu | H03H 7/42 336/182 |
| 2009/0284339 | A1 * | 11/2009 | Choi | H01F 17/0013 336/200 |
| 2010/0109123 | A1 * | 5/2010 | Strzalkowski | H01F 17/0013 257/531 |
| 2010/0141374 | A1 * | 6/2010 | Hopper | H01F 27/2804 336/226 |
| 2011/0018672 | A1 * | 1/2011 | Papananos | H01F 27/2804 336/200 |
| 2011/0148558 | A1 * | 6/2011 | Nazarian | H01F 5/003 336/189 |
| 2011/0205009 | A1 * | 8/2011 | Renteria | H01F 27/2823 336/221 |
| 2012/0322309 | A1 * | 12/2012 | Xu | H01F 17/062 439/620.06 |
| 2013/0207767 | A1 * | 8/2013 | Worthington | H01F 27/2804 336/84 C |
| 2013/0257577 | A1 * | 10/2013 | Nazarian | H01F 5/003 336/200 |
| 2014/0085002 | A1 * | 3/2014 | Anderson | H03F 1/0227 330/197 |

OTHER PUBLICATIONS

Nathan M. Neihart, et al., "Twisted Inductors for Low Coupling Mixed-Signal and RF Applications" Custom Integrated Circuits Conference, XP031361527, Sep. 21, 2008, pp. 575-578.

* cited by examiner

FIG. 6 though it was described in this background section, as well as aspects of the description that may not otherwise qualify as
PSEUDO-8-SHAPED INDUCTOR

INCORPORATION BY REFERENCE

This present disclosure claims the benefit of U.S. Provisional Application No. 61/928,787, "Pseudo-8-shaped Inductor" filed on Jan. 17, 2014, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Inductors are used in various circuits. In an example, an LC-tank based voltage controlled oscillator includes an inductor and a capacitor coupled together to form an LC tank. In another example, a switching regulator includes an inductor to act as an energy storage element.

SUMMARY

Aspects of the disclosure provide a device that includes a first inductor. The first inductor includes a first coil portion having more than one turn that defines a first enclosed area and a second coil portion having more than one turn that defines a second enclosed area. The first coil portion and the second coil portion are arranged to generate magnetic fields having substantially equal strength and opposite directions.

In an embodiment, the first coil portion and the second coil portion are connected in serial in a twisted arrangement that forms a figure-8 shape. In an example, the first coil portion forms a first differential inductor and the second coil portion forms a second differential inductor. In another example, the first coil portion forms a single-ended spiral inductor and the second coil portion forms a second single-ended spiral inductor.

In an embodiment, the first inductor further includes a third coil portion having more than one turn that defines a third enclosed area, and a fourth coil portion having more than one turn that defines a fourth enclosed area. The first coil portion and the second coil portion are connected in serial in a twisted arrangement that forms a first figure-8 shape in a first direction; the second coil portion and the third coil portion are connected in serial in a twisted arrangement that forms a second figure-8 shape in a second direction; the third coil portion and the fourth coil portion are connected in serial in a twisted arrangement that forms a third figure-8 shape in the first direction; and the fourth coil portion and the first coil portion are connected in serial in a twisted arrangement that forms a fourth figure-8 shape in the second direction.

According to an aspect of the disclosure, the first inductor has a single wire from the first enclosed area to the second enclosed area that connects the first coil portion and the second coil portion.

In an embodiment, the first inductor forms a first winding in a transformer, and the device includes a second inductor that forms a second winding in the transformer. The second inductor includes a third coil portion in parallel with the first coil portion in the first enclosed area and a fourth coil portion in parallel with the second coil portion in the second enclosed area. In an example, a majority of the first coil portion, the second coil portion, the third coil portion and the fourth coil portion is formed in a metal layer of an integrated circuit (IC) chip. In another example, a majority of the first coil portion and the second coil portion are formed in a first metal layer of an integrated circuit (IC) chip and a majority of the third coil portion and the fourth coil portion is formed in a second metal layer of the IC chip.

Aspects of the disclosure provide an integrated circuit (IC) chip having an on chip inductor formed on a substrate of the IC chip. The inductor includes a first coil portion having more than one turn that defines a first enclosed area, and a second coil portion having more than one turn that defines a second enclosed area. The first coil portion and the second coil portion are arranged to generate magnetic fields having substantially equal strength and opposite directions.

Aspects of the disclosure provide a method to form an inductor. The method includes forming a first coil portion of the inductor on a substrate. The first coil portion has more than one turn that defines a first enclosed area. Further, the method includes forming a second coil portion of the inductor on the substrate. The second coil portion has than one turn that defines a second enclosed area. Then, the method includes connecting the first coil portion and the second coil portion in a twisted arrangement that forms a figure-8 shape.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
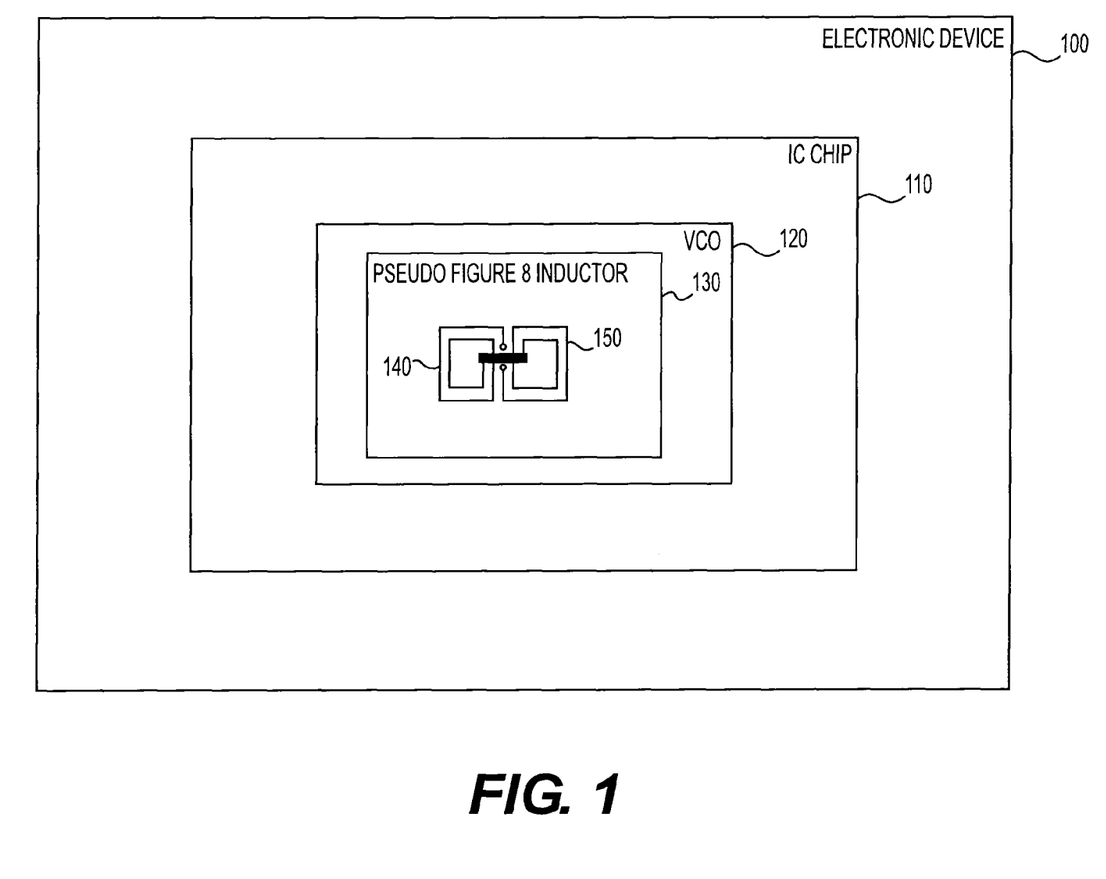
FIG. 1 shows a block diagram of an electronic device 100 according to an embodiment of the disclosure.

FIG. 1 shows a block diagram of an electronic device 100 according to an embodiment of the disclosure. The electronic device 100 includes one or more inductive components, such as an inductor, a transformer, and the like. At least one of the inductive components, such as an inductor 130 in the FIG. 1 example, includes a conductive winding that is formed in a pseudo figure-8 shape. For example, the inductor 130 includes a first coil portion 140 having more than one coil turn that defines a first enclosed area, and includes a second coil portion 150 having more than one coil turn that defines a second enclosed area. The first coil portion 140 and the second coil portion 150 are connected in a twisted arrangement that forms a figure-8 shape, such that the first coil portion 140 and the second coil portion 150 generate magnetic fields having opposite directions.

In the FIG. 1 example, the pseudo figure-8 shape is used to refer to multiple coil turns forming a single figure-8 shape to distinguish from each coil turn forming a figure-8 shape. In an example, the implementation of the inductor 130 saves area, improves quality (Q) factor and self-resonant frequency of the inductor 130 and reduces interference to other circuit components.

The electronic device 100 can be any suitable device, such as a desktop computer, a laptop computer, a tablet computer, a smart phone, a network switch, an access point, a router, a set-top box, a television, and the like, that includes one or more inductive components.

According to an aspect of the disclosure, the electronic device 100 includes an integrated circuit (IC) chip 110, and the inductor 130 is integrated with other circuit components on the IC chip 110. In an example, the IC chip 110 includes a voltage-controlled oscillator (VCO) 120 that is an LC-tank based VCO. The inductor 130 and one or more capacitors (not shown) are coupled together to form an LC tank in the VCO 120.

According to an aspect of the disclosure, the inductor 130 with the winding in the pseudo figure-8 shape has fewer crosses in the winding compared to a related inductor with coil turns in multiple figure-8 shapes. The winding of the related inductor adds two additional crosses per additional coil turn. The winding of the inductor 130 has a reduced number of crosses that simplifies layout complexity, and thus the inductor 130 can be implemented using relatively small silicon area. Further, in an embodiment, a majority of the winding of the inductor 130 is implemented in a first metal layer, and a cross in the winding is implemented in a second metal layer that connects with the first metal layer by via connections. The via connections add resistance to the winding. In an example, the second metal layer has higher sheet resistance than the first metal layer. When the number of crosses in the winding is reduced, the number of via connections is reduced, and the length of metal lines in the second metal layer is reduced, thus the resistance of the winding is reduced. The resistance reduction in the winding improves the Q factor of the inductor 130.

Further, according to an aspect of the disclosure, due to the twist between the first coil portion 140 and the second coil portion 150, inductor couplings between the inductor 130 and other inductive components are reduced. In an example, when a current flows in the inductor 130, the first coil portion 140 and the second coil portion 150 generate magnetic fields of opposite directions. Thus, when the inductor 130 is an aggressor to another inductive component, the magnetic field generated by the first coil portion 140 and the magnetic field generated by the second coil portion 150 completely or partially cancel each other at the other inductive component, and thus the interference of the inductor 130 to the other inductive component is reduced.

When the inductor 130 is a victim to another inductive component, the magnetic field generated by the other inductive component causes internal current in opposite directions in the first coil portion 140 and in the second coil portion 150. The internal current in the inductor 130 is canceled out. Thus the interference of the other inductive component to the inductor 130 is reduced, and the inductor 130 has an improved Q factor.

According to an aspect of the disclosure, inductor couplings deteriorate various circuit performance. In an example, when the IC chip 110 includes two VCOs to respectively generate two different oscillation frequencies based on two inductors. The inductor couplings of the two inductors can cause local oscillator (LO) pulling and pushing that shift an oscillation frequency from a desired frequency. In another example, when an amplifier uses multiple inductors at different amplify stages, the inductor couplings cause feedback between the amplify stages that deteriorate amplifier performance. In another example, the IC chip 110 includes multiple amplifiers that are independent of each other. The inductor couplings can cause cross-talk between the independent amplifiers that deteriorate amplifier performance.

The inductor 130 with winding in the pseudo figure-8 shape reduces inductor couplings between the inductor 130 and other inductive components, and thus improves circuit performance.

Figure 2A:
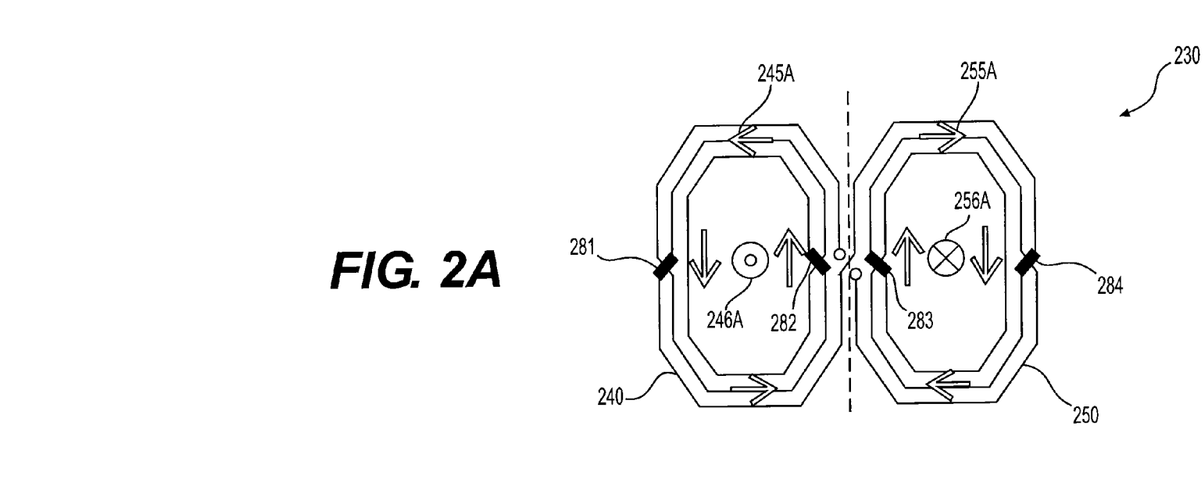
FIGS. 2A-2B show diagrams of an inductor 230 according to an embodiment of the disclosure.
Figure 2B:
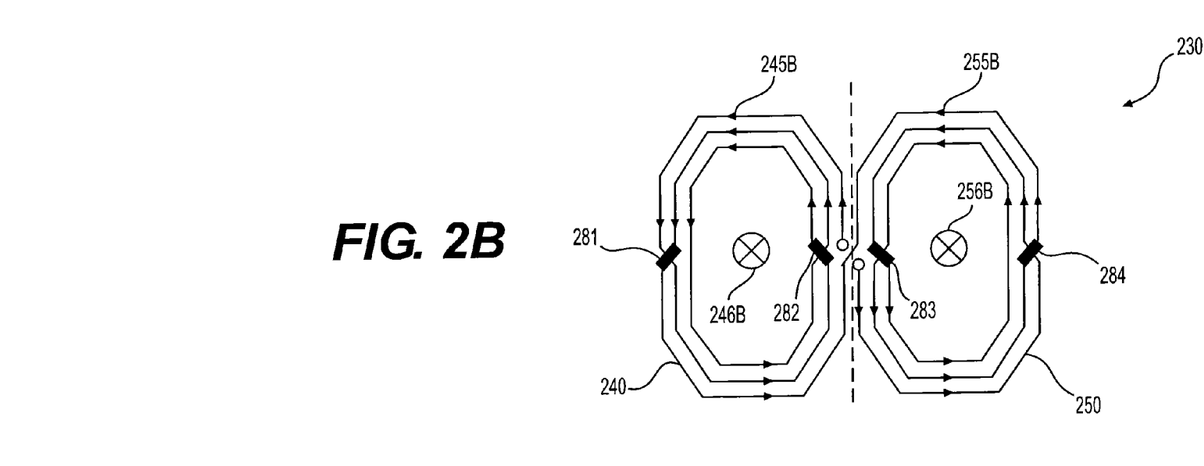

FIGS. 2A-2B show diagrams of an inductor 230 according to an embodiment of the disclosure. The inductor 230 includes a first coil portion 240 and a second coil portion 250. The first coil portion 240 includes coil turns that form a first differential inductor and the second coil portion 250 includes coil turns that form a second differential inductor. The first coil portion 240 and the second coil portion 250 are connected in serial in a twisted arrangement that forms a pseudo figure-8 shape.

In the FIGS. 2A and 2B, both the first coil portion 240 and the second coil portion 250 have three coil turns. Each of the first coil portion 240 and the second coil portion 250 has two internal crosses, as shown by crosses 281-282 and 283-284. The first coil portion 240 and the second coil portion 250 are connected without using a cross. Thus, the winding of the inductor 230 has a total of four crosses 281-284, and each cross needs to cross one coil line. In a related inductor example with coil turns in figure-8 shapes, five or six crosses are needed for three coil turns, and each cross may need to cross three or more coil lines. The winding of the inductor 230 has a reduced number of crosses that simplifies layout complexity, and thus the inductor 230 can be implemented using relatively small silicon area. Further, in an embodiment, a majority of the winding of the inductor 230 is implemented in a first metal layer, such as a copper layer, and a cross in the winding is implemented in a second metal layer, such as an uppermost metal layer which is an aluminum layer (AP), that connects with the first metal layer by via connections. The via connections add resistance to the winding. When the number of crosses in the winding is reduced, the number of via connections is reduced. Further, in an example, the first metal layer has smaller sheet resistance than the second metal layer, and each cross is implemented using a short and wide metal line in the second metal layer to cross a coil line. The use of short and wide metal line in the second metal layer further reduces winding resistance. The resistance reduction in the winding improves the Q factor of the inductor 230.

Further, according to an aspect of the disclosure, each of the differential inductors is configured into a single-ended inductor. The inductor 230 has a reduced parasitic capacitance compared to the related inductor example. In an example, because of the parasitic capacitance reduction, the inductor 230 has a higher self-resonant frequency than the related inductor example with coil turns in figure-8 shapes.

FIG. 2A shows current and magnetic fields when the inductor 230 is an aggressor inductor to a victim inductive component (not shown) according to an embodiment of the disclosure. When a current flows in the inductor 230, due to the twist between the first coil portion 240 and the second coil portion 250, the current flows in opposite directions in the first coil portion 240 and the second coil portion 250. In the FIG. 2A example, the current flows in the first coil portion 240 in a counterclockwise direction as shown by 245A, and generates a first magnetic field with a direction pointing out of the page as shown by 246A; and the current flows in the second coil portion 250 in a clockwise direction as shown by 255A and generates a second magnetic field with a direction pointing into the page as shown by 256A. The first magnetic field and the second magnetic field have opposite directions. When the first coil portion 240 and the second coil portion 250 have substantially the same shape and size, the first magnetic field and the second magnetic field have about the same strength but different directions. Thus, the first magnetic field and the second magnetic field cancel out each other's affect to the victim inductive component, and cause little interference to the victim inductive component.

FIG. 2B shows current and magnetic fields when the inductor 230 is a victim inductor to an aggressor inductive component (not shown) according to an embodiment of the disclosure. The other inductive component generates a magnetic field that may induce current in the inductor 230. In the FIG. 2B example, the magnetic field in the first coil portion 240 is shown as 246B and may cause a first current flowing in the first coil portion 240 as shown by 245B. The magnetic field in the second coil portion 250 is shown as 256B, and may cause a second current flowing in the second coil portion 250 as shown by 255B. Due to the twist between the first coil portion 240 and the second coil portion 250, the first current and the second current cancel each other, thus no current flows in the inductor 230 due to the magnetic field generated by the aggressor inductive component.

Figure 3A:
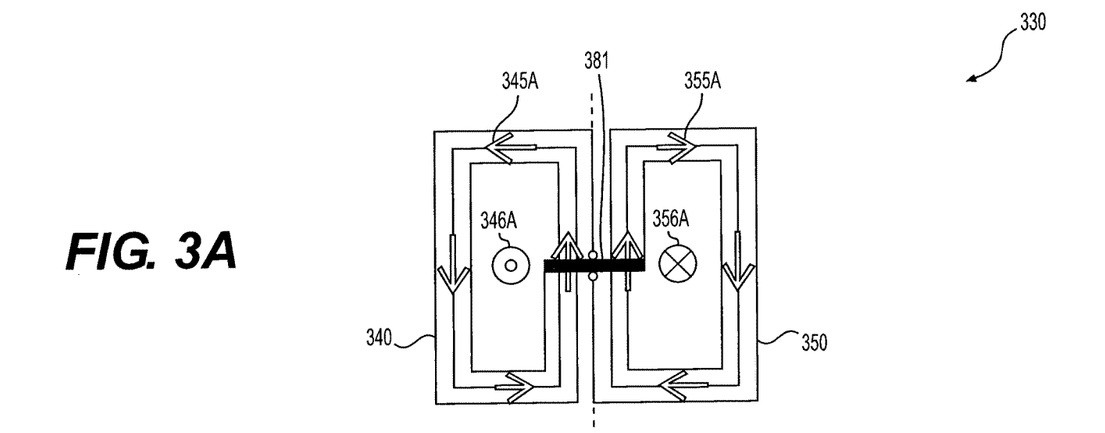
FIGS. 3A-3B show diagrams of another inductor 330 according to an embodiment of the disclosure.
Figure 3B:
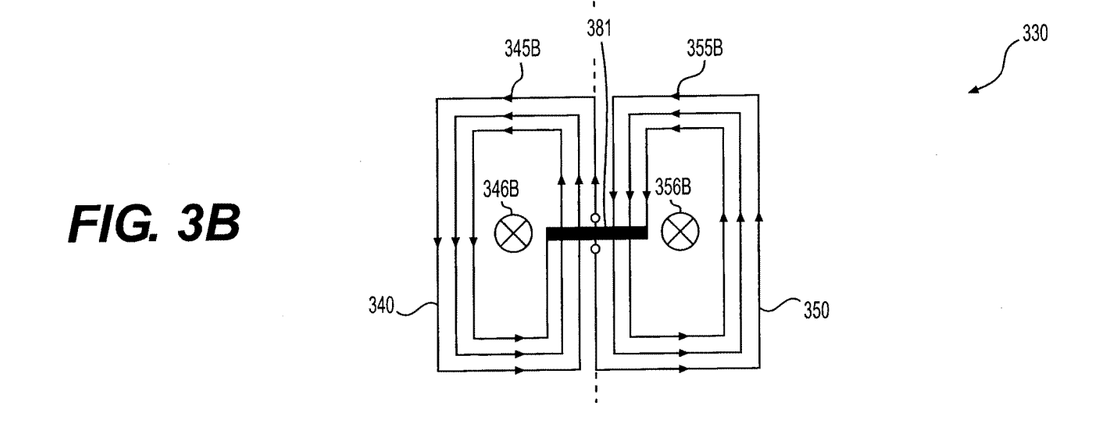

FIGS. 3A-3B show diagrams of another inductor according to an embodiment of the disclosure. The inductor 330 includes a first coil portion 340 and a second coil portion 350. The first coil portion 340 includes coil turns that form a first spiral inductor and the second coil portion 350 includes coil turns that form a second spiral inductor. The first coil portion 340 and the second coil portion 350 are connected in serial in a twisted arrangement that forms a pseudo figure-8 shape.

In the FIGS. 3A and 3B, both the first coil portion 340 and the second coil portion 350 have three coil turns, and the winding of the inductor 330 has one cross 381. In a related inductor example with coil turns in figure-8 shapes, five or six crosses are needed. The winding of the inductor 330 has a single cross that simplifies layout complexity, and thus the inductor 330 can be implemented using relatively small silicon area. Further, in an embodiment, a majority of the winding of the inductor 330 is implemented in a first metal layer, such as a copper metal layer, and the cross in the winding is implemented in a second metal layer, such as an uppermost metal layer which is an aluminum layer (AP), that connects with the first metal layer by via connections. The via connections add resistance to the winding. When the number of crosses in the winding is reduced, the number of via connections is reduced, thus the resistance of the winding is reduced. In addition, in an example, a wider AP metal line is used to further reduce resistance. The resistance reduction in the winding improves the Q factor of the inductor 330.

Further, according to an aspect of the disclosure, the spiral inductors are single-ended inductors, thus the inductor 330 has a reduced parasitic capacitance compared to the related inductor example. In an example, because of the reduced parasitic capacitance, the inductor 330 has a higher self-resonant frequency than the related inductor example.

FIG. 3A shows current and magnetic fields when the inductor 330 is an aggressor inductor to a victim inductive component (not shown) according to an embodiment of the disclosure. When a current flows in the inductor 330, due to the twist between the first coil portion 340 and the second coil portion 350, the current flows in opposite directions in the first coil portion 340 and the second coil portion 350. In the FIG. 3A example, the current flows in the first coil portion 340 in a counterclockwise direction as shown by 345A, and generates a first magnetic field with a direction pointing out of the page as shown by 346A; and the current flows in the second coil portion 350 in a clockwise direction as shown by 355A and generates a second magnetic field with a direction pointing into the page as shown by 356A. The first magnetic field and the second magnetic field have opposite directions. When the first coil portion 340 and the second coil portion 350 have substantially the same shape and size, the first magnetic field and the second magnetic field have about the same strength but different directions. Thus, the first magnetic field and the second magnetic field cancel out each other's affect to the victim inductive component, and cause little interference to the victim inductive component.

FIG. 3B shows current and magnetic fields when the inductor 330 is a victim inductor to an aggressor inductive component (not shown) according to an embodiment of the disclosure. The aggressor inductive component generates a magnetic field that may induce current in the inductor 330. In the FIG. 3B example, the magnetic field in the first coil portion 340 is shown as 346B and may cause a first current flowing in the first coil portion 340 as shown by 345B. The magnetic field in the second coil portion 350 is shown as 356B, and may cause a second current flowing in the second coil portion 350 as shown by 355B. Due to the twist between the first coil portion 340 and the second coil portion 350, the first current and the second current cancel each other, thus no current flows in the inductor 330 due to the magnetic field generated by the aggressor inductive component.

Figure 4:
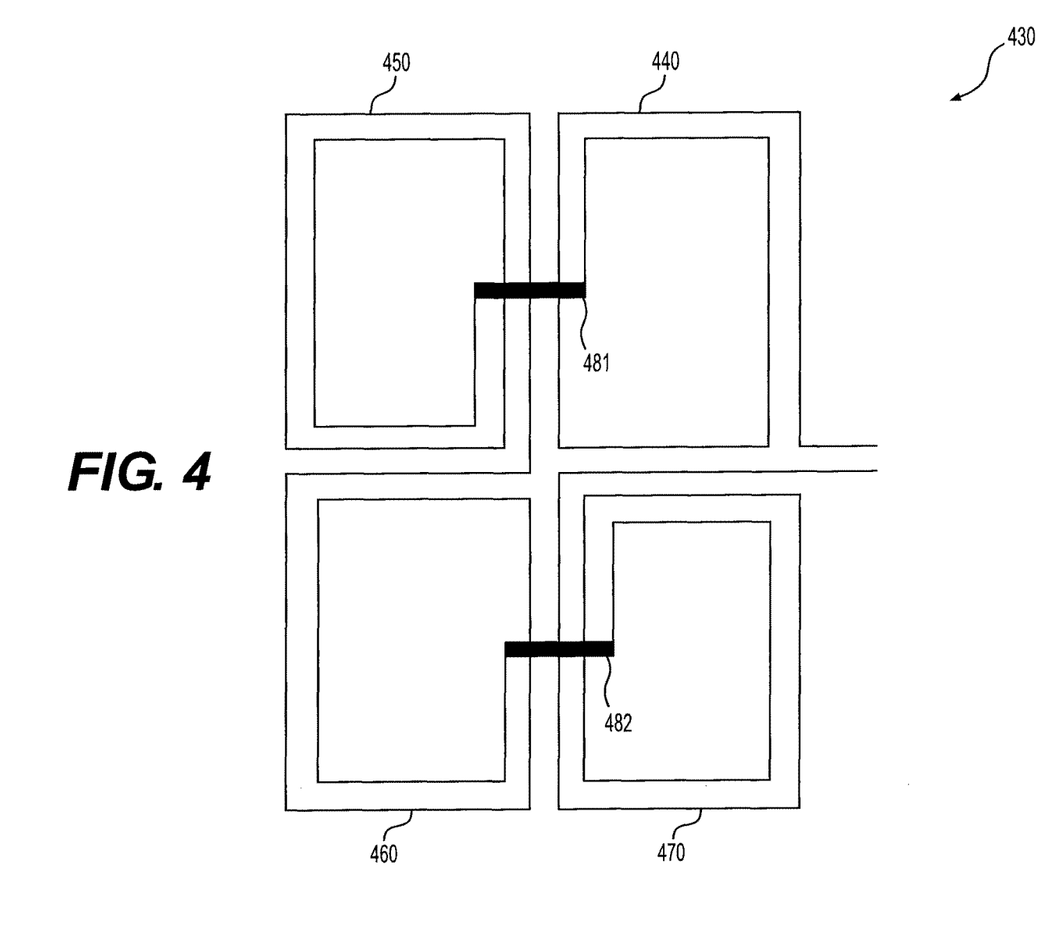
FIG. 4 shows a diagram of another inductor 430 according to an embodiment of the disclosure.

FIG. 4 shows a diagram of another inductor 430 according to an embodiment of the disclosure. The inductor 430 includes a first coil portion 440, a second coil portion 450, a third coil portion 460 and a fourth coil portion 470. The first coil portion 440 includes coil turns that form a first spiral inductor, the second coil portion 450 includes coil turns that form a second spiral inductor, the third coil portion 460 includes coil turns that form a third spiral inductor, and the fourth coil portion 470 includes coil turns that form a fourth spiral inductor. The first coil portion 440 and the second coil portion 450 are connected in serial in a twisted arrangement that forms a pseudo figure-8 shape in a first direction, such as X direction; the second coil portion 450 and the third coil portion 460 are connected in serial in a twisted arrangement that forms a pseudo figure-8 shape in a second direction, such as Y direction; the third coil portion 460 and the fourth coil portion 470 are connected in serial in a twisted arrangement that forms a pseudo figure-8 shape in the first direction; and the fourth coil portion 470 and the first coil portion 440 are connected in serial in a twisted arrangement that forms a pseudo figure-8 shape in the second direction.

In the FIG. 4 example, each of the coil portions 440-470 has two coil turns, and the winding of the inductor 430 has two crosses 481 and 482. The winding of the inductor 430 simplifies layout complexity, and thus the inductor 430 can be implemented using relatively small silicon area. Further, in an embodiment, a majority of the winding of the inductor 430 is implemented in a first metal layer, such as a copper metal layer, and the crosses in the winding are implemented in a second metal layer, such as an uppermost metal layer which is an aluminum layer (AP), that connects with the first metal layer by via connections. The via connections add resistance to the winding. When the number of crosses in the winding is reduced, the number of via connections is reduced, thus the resistance of the winding is reduced. In addition, in an example, a wider AP metal line is used to further reduce resistance. The resistance reduction in the winding improves the Q factor of the inductor 430.

Further, according to an aspect of the disclosure, the spiral inductors are single-ended inductors, thus the inductor 430 has a reduced parasitic capacitance compared to the related inductor example. In an example, because of the reduced parasitic capacitance, the inductor 430 has a higher self-resonant frequency than the related inductor example.

In the FIG. 4 example, the winding of the inductor 430 forms figure-8 shapes in both the X direction and the Y direction. Similar to the analysis in FIG. 3A, when the inductor 430 is an aggressor to a victim inductive component, the magnetic fields generated by the winding portions 440-470 cancel in both the X direction and the Y direction, and cause little interference to the victim inductive component in any of the X direction and Y direction. Similar to the analysis in FIG. 3B, when the inductor 430 is a victim to an aggressor inductive component, due to the twists that form the figure-8 shapes, current generated in the winding portions 440-470 cancels each other. Thus, no current flows in the inductor 430 due to the magnetic field generated by the aggressor inductive component.

Figure 5:
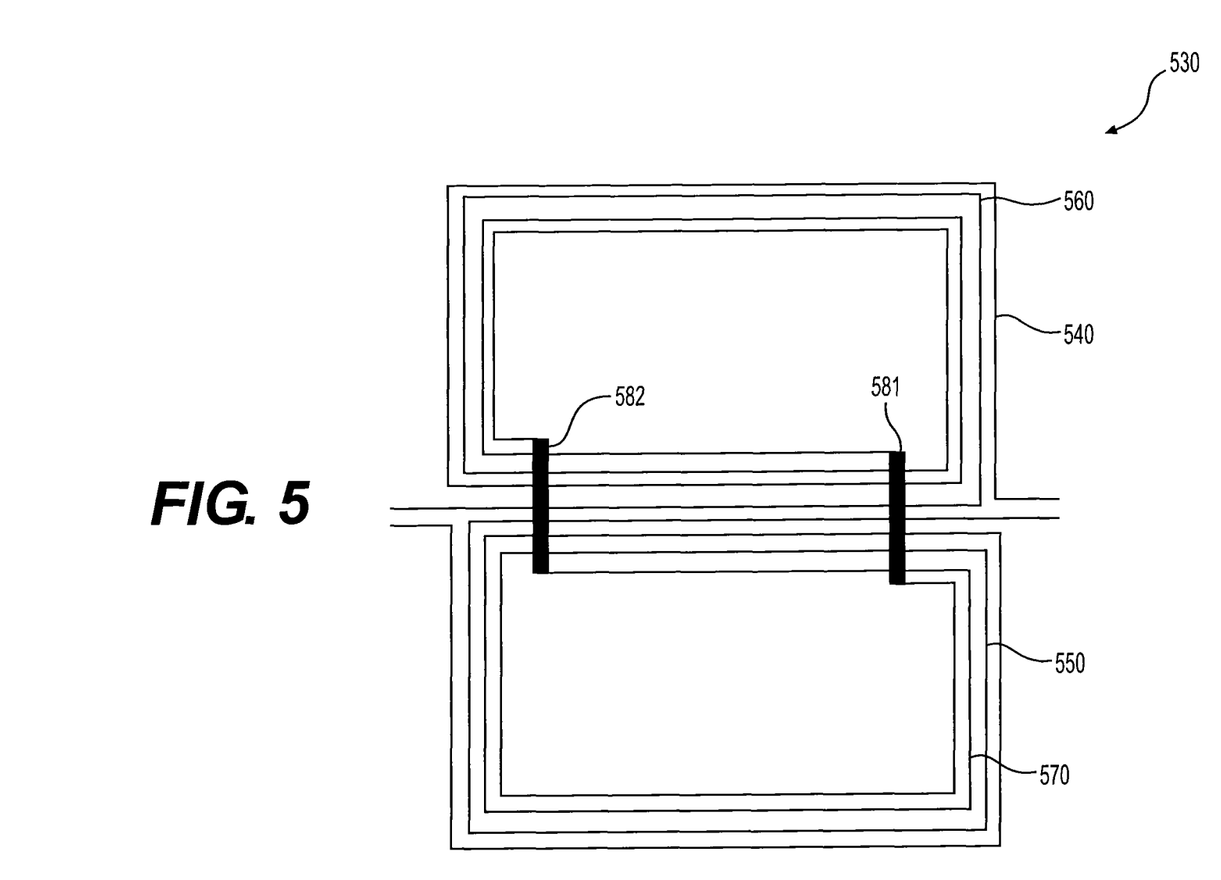
FIG. 5 shows a diagram of a transformer 530 according to an embodiment of the disclosure.

FIG. 5 shows a diagram of a transformer 530 according to an embodiment of the disclosure. The transformer 530 includes a first winding having a first coil portion 540 and a second coil portion 550, and a second winding having a third coil portion 560 and a fourth coil portion 570. The first coil portion 540 includes coil turns that form a first spiral inductor and the second coil portion 550 includes coil turns that form a second spiral inductor. The first coil portion 540 and the second coil portion 550 are connected in serial in a twisted arrangement that forms a pseudo figure-8 shape. The third coil portion 560 includes coil turns that form a third spiral inductor and the fourth coil portion 570 includes coil turns that form a fourth spiral inductor. The third coil portion 560 and the fourth coil portion 570 are connected in serial in a twisted arrangement that forms a pseudo figure-8 shape.

In the FIG. 5 example, the transformer 530 is a 1:1 transformer in which the first winding and the second winding have about the same area size and the same number of coil turns. Specifically, coil turns in the first coil portion 540 and the third coil portion 560 are interleaved to be parallel, and coil turns in the second coil portion 550 and the fourth coil portion 570 are interleaved to be parallel.

In the FIG. 5 example, the windings of the transformer 530 have two crosses 581 and 582 that simplify layout complexity, and thus the transformer 530 can be implemented using relatively small silicon area. Further, in an embodiment, a majority of the windings of the transformer 530 is implemented in a first metal layer, such as a copper metal layer, and the crosses 581 and 582 in the windings are implemented in a second metal layer, such as an uppermost metal layer which is an aluminum layer (AP), that connects with the first metal layer by via connections. The via connections add resistance to the winding. When the number of crosses in the windings is reduced, the number of via connections is reduced, thus the resistance of the windings is reduced. In addition, in an example, wider AP metal lines are used to further reduce resistance. The resistance reduction in the winding improves the Q factor of the transformer 530.

Further, according to an aspect of the disclosure, the spiral inductors in the transformer 530 are single-ended inductors, thus the transformer 530 has a reduced parasitic capacitance. In an example, because of the parasitic capacitance reduction, the transformer 530 achieves a higher self-resonant frequency.

Figure 6:
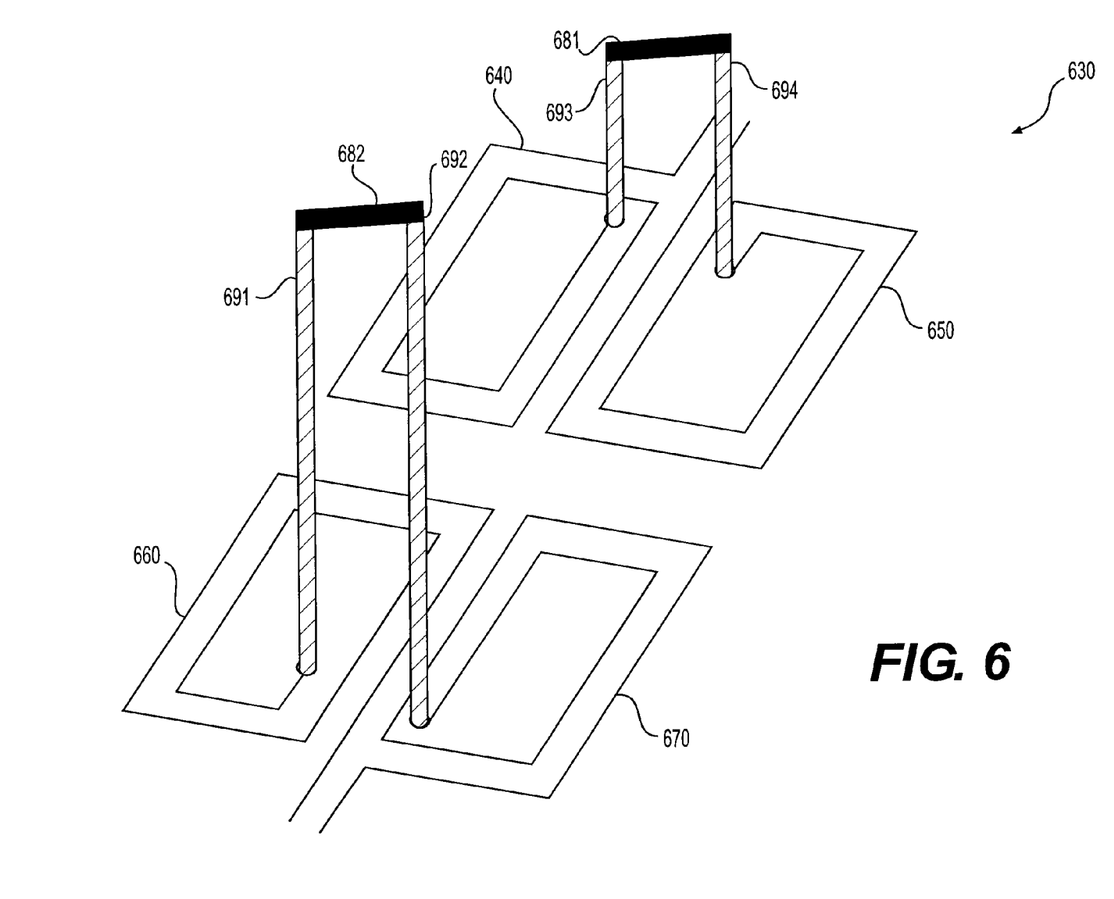
FIG. 6 shows a diagram of another transformer 630 according to an embodiment of the disclosure.

FIG. 6 shows a diagram of another transformer 630 according to an embodiment of the disclosure. The transformer 630 includes a first winding having a first coil portion 640 and a second coil portion 650, and a second winding having a third coil portion 660 and a fourth coil portion 670. The first coil portion 640 includes coil turns that form a first spiral inductor and the second coil portion 650 includes coil turns that form a second spiral inductor. The first coil portion 640 and the second coil portion 650 are connected in serial in a twisted arrangement that forms a pseudo figure-8 shape. The third coil portion 660 includes coil turns that form a third spiral inductor and the fourth coil portion 670 includes coil turns that form a fourth spiral inductor. The third coil portion 660 and the fourth coil portion 670 are connected in serial in a twisted arrangement that forms a pseudo figure-8 shape.

In the FIG. 6 example, the windings of the transformer 630 have two crosses 681 and 682 that simplify layout complexity, and thus the transformer 630 can be implemented using relatively small silicon area. Further, in the FIG. 6 example, a majority of the first winding of the transformer 630 is implemented in a first metal layer, such as a first copper metal layer, a majority of the second winding of the transformer 630 is implemented in a second metal layer, such as a second copper metal layer. The cross 681 in the first winding is implemented in a third metal layer, such as an uppermost metal layer which is an aluminum layer (AP), that connects with the first metal layer by via connections 693 and 694. In the FIG. 6 example, the cross 682 in the second winding is also implemented in the third metal layer that connects to the second metal layer by via connections 691 and 692.

In an example, a majority of the first winding and the second winding are stacked on the silicon substrate with one or more dielectric layers between the two metal layers. In an example, the patterns of the first winding and the second winding overlap to save silicon area. It is noted that the first metal layer and the second metal layer can be the same or different sheet resistance.

The transformer 630 has a relatively small number of crosses in the windings, thus the resistance of the windings is reduced. In addition, in an example, wider AP metal lines are used to further reduce resistance. The resistance reduction in the winding improves the Q factor of the transformer 630.

Further, according to an aspect of the disclosure, the spiral inductors in the transformer 630 are single-ended inductors, thus the transformer 630 has a reduced parasitic capacitance. In an example, because of the parasitic capacitance reduction, the transformer 630 achieves a higher self-resonant frequency.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:
1. A device, comprising:
 a first inductor comprising:
  a first coil portion having more than one turn that defines a first enclosed area; and a second coil portion having more than one turn that defines a second enclosed area,
wherein the first coil portion and the second coil portion are arranged to generate magnetic fields having substantially equal strength and opposite directions, and the first coil portion twisted in a first direction and the second coil portion twisted in a second direction that is different from the first direction, the first coil portion having a first pair of internal crosses crossing the first coil portion, the second coil portion having a second pair of internal crosses crossing the second coil portion, the first coil portion and the second coil portion being coupled without using any of the first and second pairs of internal crosses, the first inductor being implemented in a first metal layer, and the first and second pairs of internal crosses being implemented in a second metal layer that has a higher sheet resistance than the first metal layer.

2. The device of claim 1, wherein the twisted arrangement forms a figure-8 shape.

3. The device of claim 1, wherein the first coil portion forms a first differential inductor and the second coil portion forms a second differential inductor.

4. The device of claim 1, wherein the first coil portion forms a single-ended spiral inductor and the second coil portion forms a second single-ended spiral inductor.

5. The device of claim 1, wherein the first inductor has a single wire from the first enclosed area to the second enclosed area that couples the first coil portion and the second coil portion.

6. The device of claim 1, wherein the first inductor forms a first winding in a transformer, the device further comprises:
a second inductor comprising:
a third coil portion in parallel with the first coil portion in the first enclosed area; and
a fourth coil portion in parallel with the second coil portion in the second enclosed area, the second inductor forming a second winding in the transformer.

7. The device of claim 6, wherein a majority of the first coil portion, the second coil portion, the third coil portion and the fourth coil portion is formed in the first metal layer of an integrated circuit (IC) chip.

8. The device of claim 6, wherein a majority of the first coil portion and the second coil portion are formed in the first metal layer of an integrated circuit (IC) chip and a majority of the third coil portion and the fourth coil portion is formed in a third metal layer of the IC chip.

9. An integrated circuit (IC) chip, comprising:
a first inductor formed on a substrate of the IC chip, the first inductor comprising:
a first coil portion having more than one turn that defines a first enclosed area; and
a second coil portion having more than one turn that defines a second enclosed area,
wherein the first coil portion and the second coil portion are arranged to generate magnetic fields having substantially equal strength and opposite directions, the first coil portion twisted in a first direction and the second coil portion twisted in a second direction that is different from the first direction, the first coil portion having a first pair of internal crosses crossing the first coil portion, the second coil portion having a second pair of internal crosses crossing the second coil portion, the first coil portion and the second coil portion being coupled without using any of the first and second pairs of internal crosses, the first inductor being implemented in a first metal layer, and the first and second pairs of internal crosses being implemented in a second metal layer that has a higher sheet resistance than the first metal layer.

10. The IC chip of claim 9, wherein the twisted arrangement forms a figure-8 shape.

11. The IC chip of claim 9, wherein the first coil portion forms a first differential inductor and the second coil portion forms a second differential inductor.

12. The IC chip of claim 9, wherein the first coil portion forms a single-ended spiral inductor and the second coil portion forms a second single-ended spiral inductor.

13. The IC chip of claim 9, wherein the first inductor has a single wire from the first enclosed area to the second enclosed area that couples the first coil portion and the second coil portion.

14. The IC chip of claim 9, wherein the first inductor forms a first winding in a transformer, the IC chip further comprises:
a second inductor comprising:
a third coil portion in parallel with the first coil portion in the first enclosed area; and
a fourth coil portion in parallel with the second coil portion in the second enclosed area, the second inductor forming a second winding in the transformer.

15. The IC chip of claim 14, wherein a majority of the first coil portion, the second coil portion, the third coil portion and the fourth coil portion is formed in the first metal layer of the IC chip.

16. The IC chip of claim 14, wherein a majority of the first coil portion and the second coil portion are formed in the first metal layer of the IC chip and a majority of the third coil portion and the fourth coil portion is formed in a third metal layer of the IC chip.

* * * * *